US011669085B2

(12) United States Patent
Franke et al.

(10) Patent No.: US 11,669,085 B2
(45) Date of Patent: Jun. 6, 2023

(54) METHOD AND SYSTEM FOR DETERMINING SYSTEM SETTINGS FOR AN INDUSTRIAL SYSTEM

(71) Applicants: ABB Schweiz AG, Baden (CH); Hitachi Energy Switzerland AG, Baden (CH)

(72) Inventors: Carsten Franke, Stetten (CH); Thanikesavan Sivanthi, Birmenstorf AG (CH); Raphael Eidenbenz, Zürich (CH); Alexandru Moga, Thalwil (CH)

(73) Assignee: HITACHI ENERGY SWITZERLAND AG, Baden (CH)

( * ) Notice: Subject to any disclaimer, the term of this patent is extended or adjusted under 35 U.S.C. 154(b) by 548 days.

(21) Appl. No.: 16/724,891

(22) Filed: Dec. 23, 2019

(65) Prior Publication Data

US 2020/0201314 A1 Jun. 25, 2020

(30) Foreign Application Priority Data

Dec. 21, 2018 (EP) .................................... 18214990

(51) Int. Cl.
*G05B 23/02* (2006.01)
*G06F 30/20* (2020.01)
(Continued)

(52) U.S. Cl.
CPC ........... *G05B 23/0294* (2013.01); *G01W 1/10* (2013.01); *G06F 30/20* (2020.01); *G06Q 30/0206* (2013.01); *G06Q 50/06* (2013.01)

(58) Field of Classification Search
CPC ...... G05B 23/0294; G05B 2219/32021; G05B 13/04; G05B 17/02; G01W 1/10;
(Continued)

(56) References Cited

U.S. PATENT DOCUMENTS

2016/0247129 A1\* 8/2016 Song ...................... G06Q 10/20
2016/0333854 A1\* 11/2016 Lund ...................... F03D 7/046
(Continued)

FOREIGN PATENT DOCUMENTS

WO 2018111368 A1 6/2018

OTHER PUBLICATIONS

European Patent Office, Extended Search Report issued in corresponding Application No. 18214990.6, dated Jun. 18, 2018, 8 pp.
(Continued)

*Primary Examiner* — Tejal Gami
(74) *Attorney, Agent, or Firm* — Slater Matsil, LLP

(57) ABSTRACT

To determine system settings for an industrial system, digital twin data of a digital twin of the industrial system is retrieved. System simulations of the industrial system are performed based on the digital twin data to explore candidate system settings for the industrial system prior to application of one of the candidate system settings to the industrial system. At least one optimization objective or at least one constraint used in the system simulations is changed while the system simulations are being performed on an ongoing basis. The results of the system simulations are used to identify one of the candidate system settings for application to the industrial system.

19 Claims, 5 Drawing Sheets

(51) Int. Cl.
*G01W 1/10* (2006.01)
*G06Q 30/0201* (2023.01)
*G06Q 50/06* (2012.01)

(58) Field of Classification Search
CPC .... G06F 30/20; G06Q 30/0206; G06Q 50/06; Y02P 70/10; Y02P 90/02
See application file for complete search history.

(56) References Cited

U.S. PATENT DOCUMENTS

2017/0091791 A1 3/2017 Srinivasan et al.
2017/0323274 A1 11/2017 Johnson et al.
2018/0356806 A1 12/2018 Dave et al.

OTHER PUBLICATIONS

Zhang et al., "A Digital Twin-Based Approach for Designing and Multi-Objective Optimization of Hollow Glass Production Line," IEEE Access, Special Section on Key Technologies for Smart Factory of Industry 4.0, vol. 5, 2017, pp. 26901-26911.

* cited by examiner

METHOD AND SYSTEM FOR DETERMINING SYSTEM SETTINGS FOR AN INDUSTRIAL SYSTEM

FIELD OF THE INVENTION

The invention relates to industrial systems, in particular electric power systems. The invention relates to techniques that allow system settings of the industrial system to be changed to optimize the system behavior with regard to one or several objectives.

BACKGROUND OF THE INVENTION

In order to ensure stable operation of microgrids and other types of electric grids, such as distribution and transmission grids, the behavior of the electric system is simulated extensively before applying the derived settings to the system. Such simulations are carried out in order to make predictions about the future or to understand the properties of the system with respect to state changes. The simulations are based on models that are representative of the real system and which are typically built in software. Simulation models are extensively used by grid utilities, for example, to assist an operator in understanding how the system evolves or behaves under certain conditions.

Conventionally, the simulations are performed in an offline fashion. One reason for this is that the simulations frequently take longer than the real system time. This implies that system adaptation is based on offline analysis of data snapshots. One drawback associated therewith is that asset conditions, asset utilization as well overall system objectives, such as operation cost and/or stability, can change over time, which cannot be adequately reflected by an offline simulation.

H. Zhang et al., "A digital twin-based approach for designing and decoupling of hollow glass production line", IEEE Access, Vol. 5, 2017, pp. 26901-26911, discloses a method that uses a digital twin-based approach for rapid individualized designing of a hollow glass production line. The digital twin is used to validate a production line solution in a design and pre-production phase. This technique has limited usability as system states and system objectives may change with time.

US 2016/0333854 A1 discloses a digital twin interface for managing a wind farm having a plurality of wind turbines. The digital twin interface includes a graphical user interface (GUI) displaying a digital equivalent of the wind farm. The interface also includes one or more control features configured to optimize performance of the wind farm. While the system facilitates control of the wind farm, it requires user input for determining optimum operation parameters. The digital twin interface may not adequately reflect system objectives that may change over a longer time horizon, and may not adequately take into account that an operation parameter may no longer be optimum if, e.g., system objectives or system states change.

There is a continued need in the art for improved methods and systems for determining system settings, which allow varying system objectives to be taken into account. There is a continued need in the art for methods and systems for determining settings of electric power systems, such as microgrids, distributed energy resources (DERs), distribution and transmission grids, and other electrical power systems.

SUMMARY

It is an object of the invention to provide improved techniques for determining settings of industrial systems, such as electric power systems. It is an object of the invention to provide techniques for determining possible settings of industrial systems that are capable of taking into account changes in system states and system objectives. It is an object of the invention to provide techniques that assist an operator in identifying optimum settings of industrial systems on an ongoing basis, in particular continuously, during operation of an industrial system.

A method, computer-readable instruction code, and a computing system as recited in the independent claims are provided. The dependent claims define embodiments.

Embodiments of the invention combine a digital twin with ongoing or continuous system simulation, e.g., in an optimization routine. The digital twin can be used for online determination of system settings, because the disclosed techniques can use active learning and are capable of accommodating changing objectives.

As used herein, the term "determination of system settings" may be an exploration of candidate system settings. The exploration may comprise determining an approximated Pareto front of possible solutions. Information on the exploration, that is performed based on the digital twin, may be provided to an operator for the final selection of a system setting that is to be applied to the real-world industrial system.

According to embodiments, a digital twin, which mimics the behavior of a real-world industrial system (e.g., of a real-world electric grid) as well as the behavior of the control and communication subsystem of the industrial system, can be used by an optimization engine to determine possible desired system settings with respect to different objectives (e.g., cost, stability, fault tolerance, redundancy, energy consumption, emission minimization, customer reliability etc.) or different constraints. By using digital twin data to derive optimized system settings for the industrial system with respect to specified objective(s) and/or specified constraint(s), the Pareto front of possible optimized system settings can be determined without interfering with the system operation of the real-world industrial system.

A multi-objective optimization engine may be used that operates based on digital twin data. The multi-objective optimization engine can generate an approximation of a Pareto-front of possible solutions by parameterizing problem instances based on the digital twin data, and by simulating these problem instances.

The system simulations may be parametric simulations. One or several parameters, such as values of a variable that are comprised by the system settings and that are used in the system simulations, are changed from one run to another of the system simulation, while other parameters are kept constant. The effect of the change in the varied parameter on an objective, which may be quantified by an objective function, and/or on a tradeoff between different objectives can be observed.

The digital twin can continuously synchronize with the real system. The multi-objective optimization engine can explore the solution space with respect to the objectives in an ongoing, in particular continuous manner. The system settings of the real-world industrial system can be adapted continuously and, optionally, automatically.

A method of determining system settings for an industrial system, in particular an electric power system, according to an aspect of the invention comprises the following steps performed by a computing system: retrieving digital twin data of a digital twin of the industrial system; performing system simulations of the industrial system based on the digital twin data to explore candidate system settings for the industrial system prior to application of one of the candidate system settings to the industrial system, the system simulations being performed on an ongoing basis during commissioning and/or operation of the industrial system; and providing results of the system simulations for identifying one of the candidate system settings for application to the industrial system.

In preferred embodiments, at least one optimization objective and/or at least one constraint of the system simulations may be changed while the system simulations are being performed on an ongoing basis. The change in at least one optimization objective and/or at least one constraint may be triggered by a user input or by another trigger event.

When triggered by a trigger event different from a user input, the change in at least one optimization objective and/or at least one constraint may be applied automatically.

As the system simulations are performed on an ongoing basis during commissioning and/or operation of the industrial system, changes in system parameter settings, in system objectives and/or in system constraints can be taken into consideration when determining a suitable candidate system setting that is to be applied to the industrial system.

The system simulations may be performed continuously during commissioning and/or operation of the industrial system.

The system simulations may be parametric simulations.

One parameter or several parameters may be changed from one run of the system simulation to another run of the system simulation, while all other parameters may be kept constant. This allows the effect of a change of the respective parameter on one or several objectives to be quantified.

In a first set of system simulations, a first parameter may be varied in between at least two runs of system simulations to identify an effect of the change of the first parameter on one or several objectives, as quantified by, e.g., an objective function.

In a second set of system simulations, a second parameter may be varied in between at least two runs of system simulations to identify an effect of the change of the second parameter on one or several objectives, as quantified by, e.g., an objective function, with the second parameter being different from the first parameter.

The first parameter and the second parameter may relate to distinct Intelligent Electronic Devices (IEDs) of an Industrial Automation Control System (IACS), e.g., an electric grid.

The first parameter may relate to a circuit breaker, transformer, transmission line, generator, distributed energy resource, or other primary device of the power network. The second parameter may relate to an IED.

The system simulations may be performed in a multi-objective optimization routine that uses the digital twin data.

The multi-objective optimization routine may parameterize problem instances, based on the digital twin data, and may simulate these problem instances.

The multi-objective optimization routine may thereby generate an approximation of a Pareto-front of possible system settings.

A selection of one of the candidate system settings for application to the industrial system may be made via an operator at a user interface, based on the results of the system simulations.

The method may further comprise receiving an input that alters at least one objective and/or at least one constraint of the multi-objective optimization, and modifying the multi-objective optimization routine in response to the input.

The input may be an operator input. Alternatively or additionally, the input may be a trigger event that may be detected in the industrial system or by monitoring an event separate from the industrial system.

Performing the system simulations may comprise retrieving additional information different from the digital twin data and using the additional information in the system simulations.

The additional information may be retrieved from a source distinct from the industrial system.

The additional information may comprise weather data and/or resource price data.

The additional information may comprise forecast information relating to a future point in time.

The method may further comprise continuously updating the digital twin to ensure consistency of the digital twin with the industrial system during operation of the industrial system.

The industrial system may comprise a plurality of control devices and a communication network connected to the plurality of control devices. The digital twin may be continuously updated based on control commands issued by the plurality of control devices and based on messages transmitted in the communication network.

The industrial system may be an industrial automation control system, IACS.

The control devices may be intelligent electronic devices, IEDs.

The industrial system may comprise circuit breakers or switches. The digital twin may be updated based on the state of the circuit breakers or switches, based on control signals issued by IEDs, and based on messages received or transmitted by IEDs.

The method may comprise applying the identified one of the candidate system settings on-the-fly to the industrial system.

Applying the identified one of the candidate system settings comprises transferring the one of the candidate system settings identified for the digital twin by a system simulation, e.g. in a multi-objective optimization, to the industrial system.

The identified one of the candidate system settings may be selected by an operator input received at a user interface, based on, e.g., a set of possible candidate solutions that has been automatically determined.

The identified one of the candidate system settings may be determined automatically and may be applied automatically, e.g., in response to a trigger event.

The method may further comprise using the digital twin data to validate the identified one of the candidate system settings prior to application to the industrial system.

The industrial system may be an electric power grid or part of an electric power grid.

The industrial system may be a distributed energy resource, DER, or a microgrid.

Computer-readable instruction code according to an aspect of the invention comprises instructions which, when executed by at least one processor of a computing device, cause the at least one processor to perform the method according to an embodiment.

A tangible computer readable medium according to an embodiment has stored thereon instructions which, when executed by at least one processor, cause the at least one processor to perform the method according to an embodiment.

A computing system according to an aspect of the invention comprises at least one integrated semiconductor circuit programmed to: retrieve digital twin data of a digital twin of an industrial system, in particular an electric power system; perform system simulations of the industrial system based on the digital twin data to explore candidate system settings for the industrial system prior to application of the system settings to the industrial system, wherein the system simulations are performed on an ongoing basis during commissioning and/or operation of the industrial system; and providing the results of the system simulations to identify system settings to be applied to the industrial system.

In preferred embodiments, the computing system may be configured to allow at least one optimization objective and/or at least one constraint of the system simulations to be changed while the system simulations are being performed on an ongoing basis.

The change in at least one optimization objective and/or at least one constraint may be triggered by a user input or by another trigger event.

The computing system may be adapted to perform the method according to an embodiment.

The computing system may have a data interface configured to be coupled to an industrial automation control system of the industrial system.

The computing system may be configured to monitor messages transmitted in a communication network of the industrial automation control system via the data interface.

The computing system may be configured to provide a computer-implemented representation of the digital twin.

The computer implemented representation of the digital twin may reflect both primary components of an electric power system and secondary components of the electric power system, as well as communication between the secondary components. The secondary components may comprise IEDs and/or merging units.

According to an embodiment, there is provided a combination of an industrial system and the computing system coupled to the industrial system. The computing system combines a digital twin representation of the industrial system with multi-objective optimization to determine optimum system settings on an ongoing basis, in particular continuously.

The industrial system may be an industrial automation control system, IACS.

The industrial system may be an electric power grid, a part of an electric power grid, a microgrid, or a DER.

In the methods and computing systems according to embodiments of the invention, the digital twin can be operative to capture the actual dynamics and state of the industrial system. The digital twin can be used together with a multi-objective optimization engine that derives an approximation of the Pareto-front of suitable system settings, which represent a solution to a multi-objective optimization problem. The derived solution can be used for allowing informed decisions to be made by an operator of the industrial system. Alternatively or additionally, the identified candidate system setting that provides the optimum solution to the multi-objective optimization problem can be automatically applied to the real-world industrial system.

The methods and computing systems according to embodiments accommodate varying system objectives and/or system constraints. System objectives and/or system constraints may vary while a sequence of system simulations is performed on an ongoing basis during commissioning and/or during live operation of the industrial system.

The method and computing system can be adapted to output information on the optimum system settings to the system operator. The method and computing system can be adapted to output the information on the optimum or possible candidate system settings for respectively each one of a variety of different system objectives and/or for each one of a variety of combinations of system objectives and/or for each one of a variety of different system constraint(s) or combinations of system constraints.

The method and computing system according to embodiments of the invention enable the system operator to change or to add optimization objectives dynamically. The corresponding system settings determined for the changed optimization objective can be applied to the real-world industrial system. This can be done automatically or in response to a system operator input.

Various effects and advantages are attained by the methods and computing systems according to the invention. For illustration, the methods and systems according to embodiments allow suitable system settings of industrial systems to be determined on an ongoing basis, in particular continuously, during operation of an industrial system, before the system settings are applied to the industrial system. The methods and systems according to embodiments allow system settings of a real-world industrial system to be updated online, i.e., during operation of the real-world industrial system. Active learning can be implemented by the combination of the digital twin and the multi-objective optimization. The methods and systems according to embodiments can accommodate varying system objectives and/or system constraints.

The techniques disclosed herein can be applied to various industrial systems, such as electric grids, microgrids, distributed energy resources, distribution or transmission networks, without being limited thereto.

BRIEF DESCRIPTION OF THE DRAWINGS

The subject-matter of the invention will be explained in more detail with reference to preferred exemplary embodiments which are illustrated in the attached drawings, in which.

DETAILED DESCRIPTION OF EMBODIMENTS

Exemplary embodiments of the invention will be described with reference to the drawings in which identical or similar reference signs designate identical or similar elements. While some embodiments will be described in the context of specific industrial systems, such as electric grids, microgrids, distributed energy resources, distribution or transmission networks, the embodiments are not limited thereto.

The features of embodiments may be combined with each other, unless specifically noted otherwise.

Figure 1:
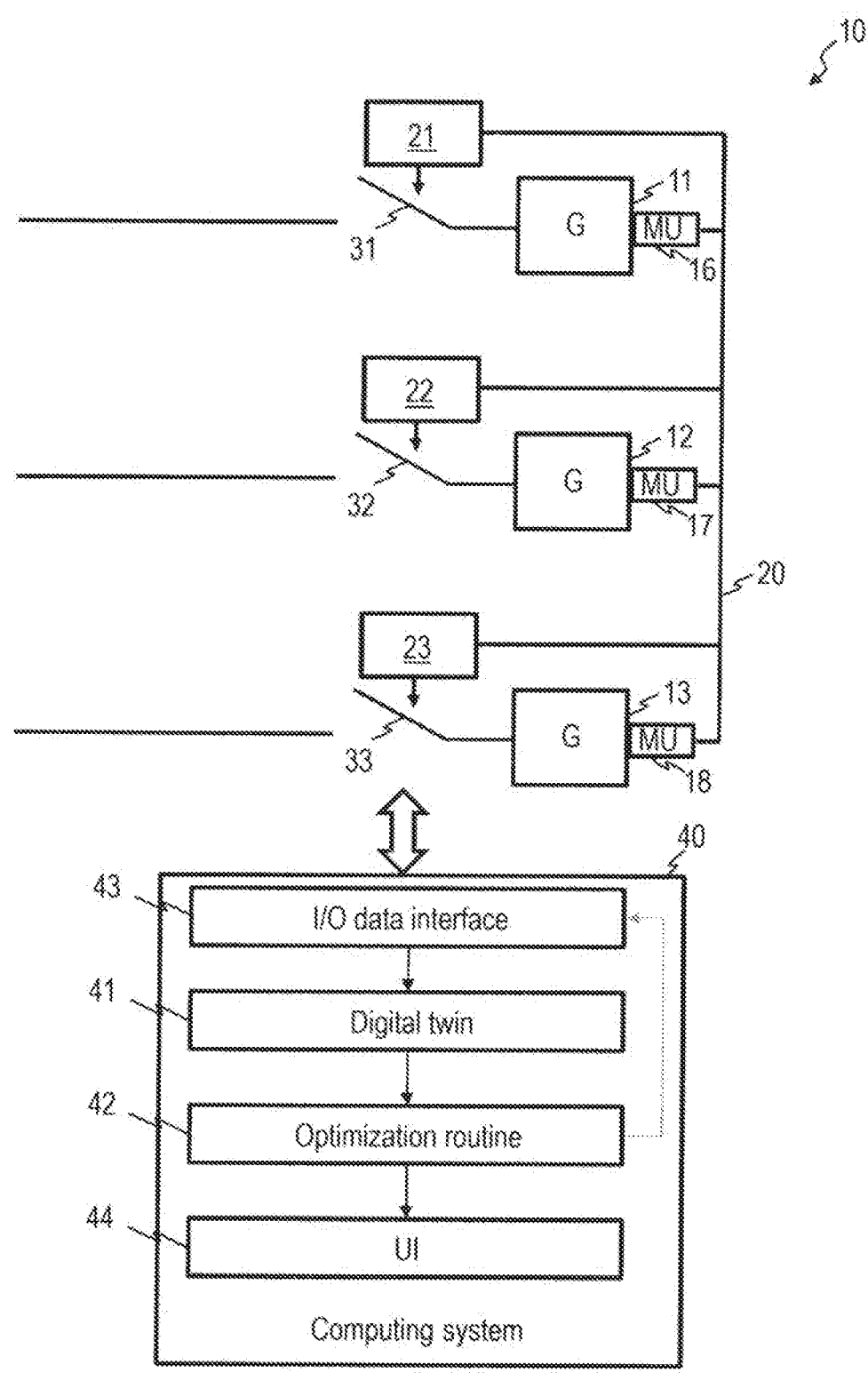
FIG. 1 is a block diagram representation of an industrial system and computing system according to an embodiment.

FIG. 1 is a block diagram of an industrial system 10 and a computing system 40 which determines suitable settings for the industrial system 10.

The industrial system 10 may be an electric power system. The electric power system may comprise a number of generators 11, 12, 13, which may form a distributed energy resource (DER) or microgrid. Alternatively, some of the generators 11, 12, 13 may be implemented as a DER.

The electric power system may comprise circuit breakers or switches 31, 32, 33. The circuit breakers or switches 31, 32, 33 may be associated with the generators 11, 12, 13 or with terminals of a transmission line. While three generators 11, 12, 13 and associated switches 31, 32, 33 are exemplarily illustrated in FIG. 1, any other topology and configuration of the electric power grid may be used for applying the concepts disclosed herein.

The electric power system may comprise several control devices 21, 22, 23. The control devices 21, 22, 23 may be implemented as IEDs. The control devices 21, 22, 23 may provide control signals to their associated circuit breakers or switches 31, 32, 33.

The electric power system may comprise a communication system 20. The communication system 20 may be implemented as a communication system of an industrial automation control system. Data from merging units 16, 17, 18 or sensors may be provided to the control devices 21, 22, 23 via the communication system 20. Alternatively or additionally, the control devices 21, 22, 23 may output messages for transmission via the communication system 20.

A computing system 40 according to an embodiment is provided to determine suitable system settings for the electric power system 10. The computing system 40 may be configured to explore possible system settings, so as to approximate a Pareto-front of possible system settings. A system operator may select a candidate system setting for application to the electric power system 10.

The computing system 40 may comprise one or several integrated semiconductor circuits, such as one or more processors, controllers, or application specific integrated circuits (ASICs) to perform the operations that will be described in more detail below.

The computing system 40 may be a computer, a server, which may reside in the cloud, or a distributed computing system.

Generally, the computing system 40 combines a digital twin 41 of the real-world industrial system 10 and an optimization engine 42. The optimization engine 42 uses the digital twin data of the digital twin 41 to explore possible changes in system settings that can be applied to the industrial system 10 and to determine in optimum one among plural candidate system settings. By operating based on the digital twin data, the optimization engine 42 does not need to interfere with the operation of the real-world industrial system 10 until an optimum system setting has been found and until this optimum system setting is to be applied to the real-world industrial system 10.

The digital twin 41 mimics the behavior of the industrial system 10 (e.g., of a real electric grid) as well as the behavior of the control and communication systems of the industrial system 10. For an electric power system, the digital twin 41 can be adapted to mimic the behavior of the primary components and the secondary components as well as the communication system connecting the secondary components of the electric power system.

The optimization engine 42 is operative to extract possible system settings with respect to different objectives and/or different constraints. The different objectives may include one or several of cost, stability criteria, redundancy criteria, energy consumption, emission minimization, customer reliability etc. of the operation of the industrial system 10. The objectives and/or constraints may change dynamically while a sequence of system simulations is performed on an ongoing, in particular continuous, manner.

The computing system 40 is adapted to accommodate changing priorities for the different objectives and/or the fact that new objectives can become relevant. Alternatively or additionally, the computing system 40 is adapted to accommodate changing priorities for the different constraints and/or the fact that new constraints can become relevant. The computing system 40 may have a user interface 44 that can allow a system operator to specify changing priorities for different objectives and/or to define new objectives. The interface 44 can allow the system operator to specify changing priorities for different constraints and/or to define new constraints.

The optimization engine 42 uses the digital twin 41 to derive optimized settings for the real-world system 10 with respect to the specified objective(s), without interfering with the real system operation. The optimization engine 42 can be implemented as a multi-objective optimization engine that generates an approximation of a Pareto-front of possible solutions. To this end, the optimization engine 42 may be adapted to parameterize problem instances, based on the digital twin data retrieved from the digital twin 41, and to simulate these problem instances.

The computing system 40 can enable the system operator to change or to add optimization objectives dynamically. For illustration, the optimization engine 42 may find candidate system settings by exploring possible solutions to an objective function of the following form:

$$C(s_1, \ldots, s_N) = \Sigma_j \alpha_j C_j(s_1, \ldots, s_N) \quad (1)$$

In Equation (1), $(s_1, \ldots, s_N)$ denotes a parameter set that is collectively referred to as system setting. The parameter set may include parameters defining the operation of the various IEDs 21, 22, 23 of the industrial system 10, for example. $C_j(s_1, \ldots, s_N)$ denotes the objective function associated with the $j^{th}$ objective of several objectives. For illustration, the objective function $C_j(s_1, \ldots, s_N)$ may represent the financial costs associated with operation or installation of the industrial system 10, stability criteria, redundancy criteria, energy consumption, emission minimization, customer reliability etc. The coefficients $\alpha_j$ represent weighting factors. In a multi-objective optimization, the coefficients $\alpha_j$ may be adjustable in response to a user input, for example. The coefficients $\alpha_j$ may vary as a function of time.

Constraints may be imposed in various ways, e.g., as hard constraints or as penalty term in the objective function. For illustration, the optimization engine 42 may find candidate system settings by exploring possible solutions to an objective function of the following form:

$$C(s_1, \ldots, s_N) = \Sigma_j \alpha_j C_j(s_1, \ldots, s_N) + \Sigma_k \beta_k P_k(s_1, \ldots, s_N) \quad (2)$$

where $P_{k\,j}(s_1, \ldots, s_N)$ denotes the penalty associated with the $k^{th}$ constraint of several constraints. The coefficients $\beta_k$ represent weighting factors. The coefficients $\beta_k$ may be adjustable in response to a user input, for example. The coefficients $13_k$ may vary as a function of time.

The computing system 40 has a data interface 43. The data interface 43 allows the digital twin 41 to be continuously updated so as to mimic the industrial system 10 during operation of the industrial system 10. This allows the computing system 40 to be used for identifying suitable system settings not only during commissioning, i.e. prior to operation of the industrial system 10, but also during ongoing operation of the industrial system 10. System settings of the industrial system 10 may be adjusted not only off-line, but also online during ongoing operation of the industrial system 10.

In order to mitigate the drawbacks associated with potentially long simulation times, the optimization engine 42 may continuously perform simulations that explore the suitability of various candidate system settings with respect to different system objectives. When a system setting of the industrial system 10 changes in the real-world, this may be taken into consideration by the respective update of the digital twin 41, which provides the digital twin data on which the optimization engine 42 operates.

When a system objective and/or system constraint of the industrial system 10 changes, this may be taken into consideration by the optimization engine 42.

The system simulations that are performed may be parametric simulations. One parameter or several parameters may be changed from one run of the system simulation to another run of the system simulation, while all other parameters may be kept constant. This allows the effect of a change of the respective parameter on one or several objectives to be quantified.

In a first set of system simulations, a first parameter (e.g., $s_1$) may be varied in between at least two runs of system simulations to identify an effect of the change of the first parameter on one or several objectives, as quantified by, e.g., an objective function. In a second set of system simulations, a second parameter (e.g., $s_2$) may be varied in between at least two runs of system simulations to identify an effect of the change of the second parameter on one or several objectives, as quantified by, e.g., the objective function $C(s_1, \ldots, s_N)$, with the second parameter $s_2$ being different from the first parameter $s_1$.

The first parameter and the second parameter that are varied in different sets of runs of the system simulation may relate to different Intelligent Electronic Devices (IEDs). Parameters relating to primary and secondary devices of an electric grid may be varied successively in different sets of runs of the system simulation. The first parameter may relate to a circuit breaker, transformer, transmission line, generator, distributed energy resource, or other primary device of the power network. The second parameter may relate to an IED.

During system setup (or pre-production) as well as during system operation (or production), the multi-objective optimization engine 42 (e.g. NGSA II) uses the digital twin 41 to explore the solution space of possible solutions with regards to system objectives. System settings related to the different solutions of the multi-objective optimization are explored.

The computing system 40 may allow the system operator to use the explored solutions to select and/or modify operational points of the industrial system 10. The settings from the digital twin 41 that are related to the selected solution are then applied to the industrial system 10. Application of the selected one of the explored system settings to the industrial system 10 may happen in response to a dedicated user or request or automatically.

The computing system 40 and methods according to embodiments of the invention improve several aspects of adjusting system settings of the industrial system 10 and of tuning the industrial system 10 to an optimum operating state. The continuous exploration of possible system states with respect to different optimization objectives (e.g. cost, stability criteria, redundancy criteria, energy consumption, emission minimization, customer reliability etc.) using simulations based on digital twin data enables the system operator to have a better understanding of the system and the scenarios. For illustration, information on the respective optimum system settings may be output via the user interface 44. Time-varying system objectives and/or constraints may be taken into consideration.

Using the information from the digital twin 41, e.g. on possible system operating points, also helps the system operator to make informed decisions. The computing system 40 and methods according to embodiments allow system tuning to be performed in a continuous way. I.e., changes to system settings that improve the industrial system 10 with respect to certain objectives and/or certain constraints do not need to be triggered periodically by a system operator, but can be performed continuously, optionally automatically, in the background.

Figure 6:
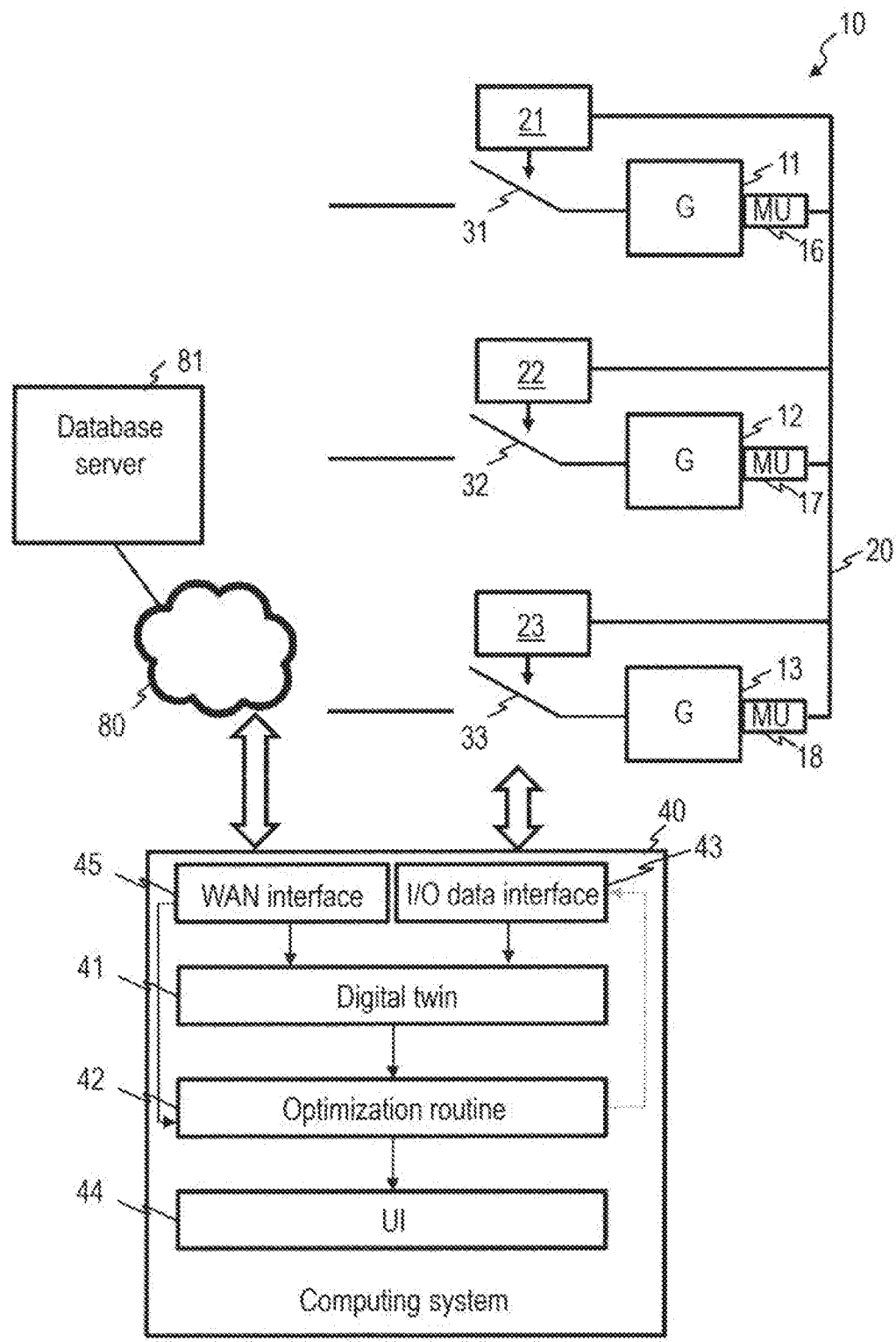
FIG. 6 is a block diagram representation of an industrial system and computing system according to an embodiment.

The optimization using the digital twin data can also use external data sources, as will be explained in more detail with reference to FIG. 6. This allows weather data, resource prices, or other external data, which might have a real impact on the stability or the system operational costs or system constraints, to be integrated automatically in the optimization procedure. The external data sources may provide additional data that includes forecast data, such as weather forecast data.

Figure 2:
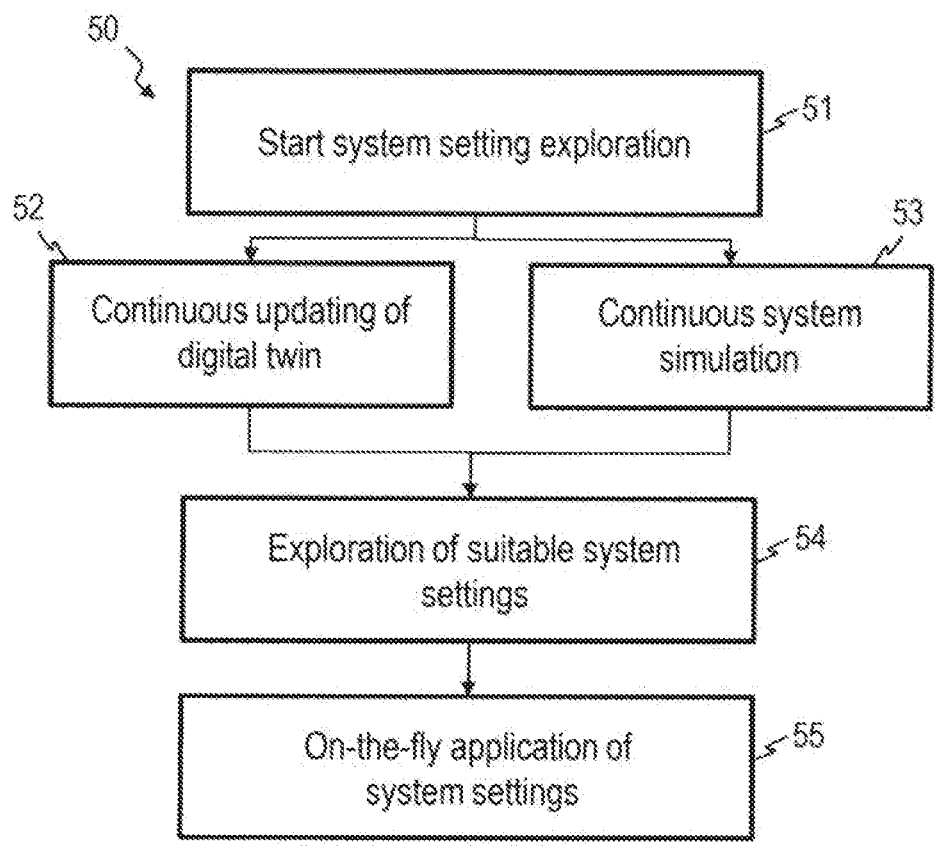
FIG. 2 is a flow chart of a method according to an embodiment.

FIG. 2 is a flow chart of a method 50 according to an embodiment. The method 50 may be performed automatically by the computing system 40.

At step 51, a system setting exploration is started. This may be done, e.g., during an ongoing operation of an electric grid, microgrid, or other electric power system.

At step 52, during the ongoing operation of the industrial system, the digital twin 41 is continuously updated in accordance with changes of the real-world industrial system 10.

Concurrently, at step 53, system simulations may be performed on an ongoing basis, in particular continuously. The system simulations may be performed by a multi-objective optimization engine, as has been explained above. At step 53, different system objectives and/or system constraints can be explored by the continuous system simulations using the digital twin data. This may not only happen during ongoing live operation of the industrial system 10, but also during commissioning, for example. The continuous system simulations at step 53 may result in an approximation to a Pareto-front, which is automatically determined by the computing system 40. The system simulations may be parametric simulations.

At step 54, suitable system settings may be determined based on the results of the system simulation at step 53, which is based on the digital twin data.

At step 55, the system settings that have been determined to be optimum in the exploration of suitable system settings may be applied to the industrial system 10. Application of the identified one of the candidate system settings may occur in response to a user request. The system settings that are applied may be selected by a system operator, based on the system simulations. Alternatively, application of the identified one of the candidate system settings may occur automatically in the background.

Steps 52 to 55 may be executed in a loop. Thereby, the system settings of the industrial system 10 may be updated periodically during ongoing operation of the industrial system 10.

Changes in system settings may not only be the result of changing system states, but may also result from changes in system objectives or system constraints. For illustration, the system operator may modify one or several objectives and/or one or several constraints of a multi-objective optimization at any point in time. The resultant change in optimum system settings that is determined computationally by the multi-objective optimization routine based on the digital twin data can be applied to the real-world industrial system 10 automatically or in response to a request from the system operator.

Figure 3:
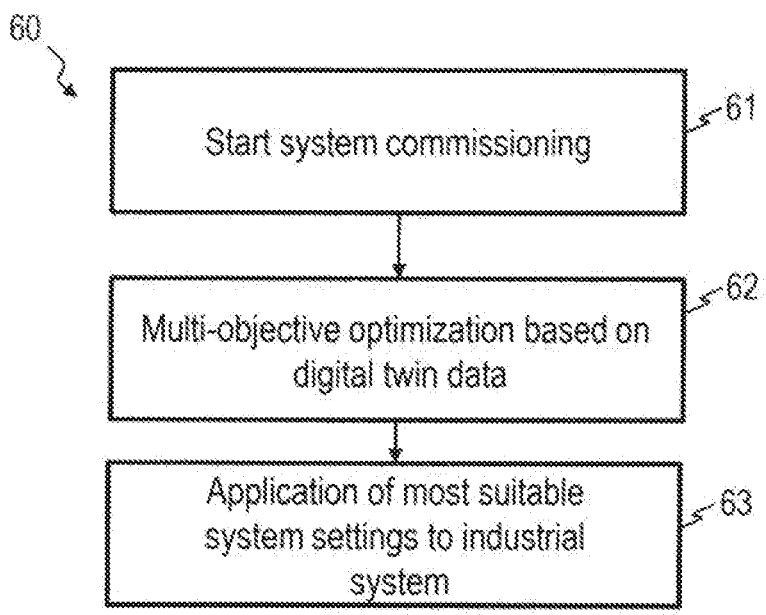
FIG. 3 is a flow chart of a method according to an embodiment.

FIG. 3 is a flow chart of a method 60 according to an embodiment. In the method 60, multi-objective optimization based on digital twin data 62 is performed during commissioning.

At step 61, commissioning is started.

At step 62, a multi-objective optimization based on digital twin data is performed. Step 62 may be implemented as described, e.g., with respect to FIG. 1 and FIG. 2.

At step 63, one of the explored can the candidate system settings can be applied to the industrial system 10, before the industrial system 10 starts operation. The candidate system setting may optionally be validated using the same digital twin before it is being applied to the industrial system 10.

Figure 4:
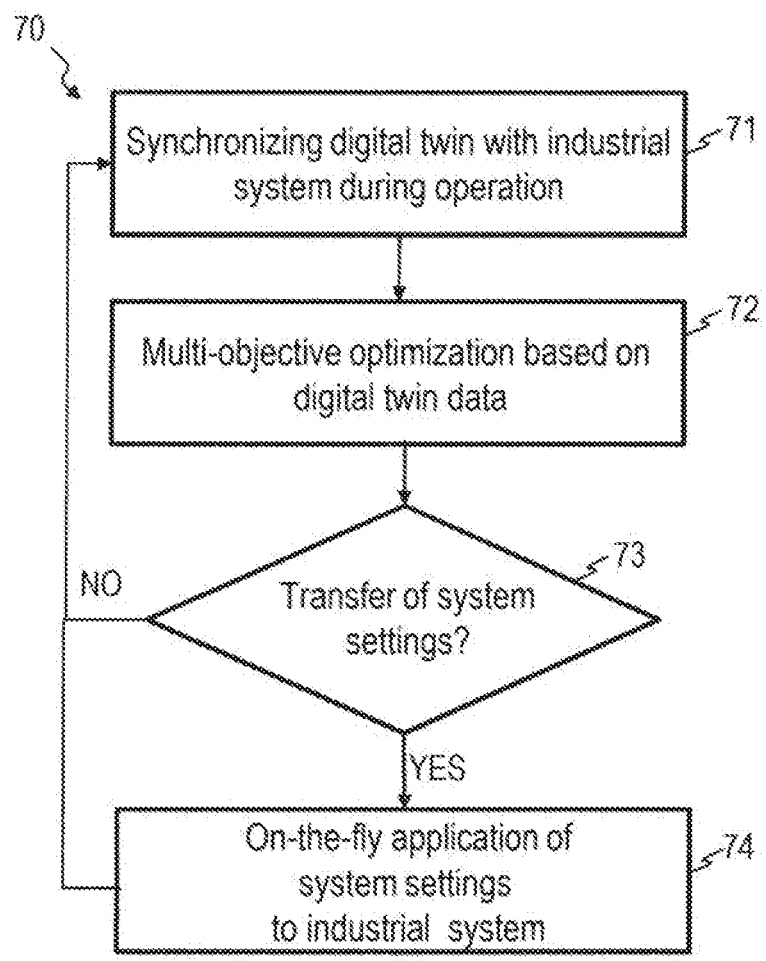
FIG. 4 is a flow chart of a method according to an embodiment.

FIG. 4 is a flow chart of a method 70 according to an embodiment. The method 70 may be performed automatically by the computing system 40.

At step 71, the digital twin 41 is synchronized with the industrial system 10 during operation of the industrial system 10. This may involve monitoring, by the computing system 40, messages transmitted in the communication network 20 of the industrial system 10. Synchronizing the digital twin 41 with the industrial system 10 may comprise adapting the digital twin 41 to changes in physical devices of the industrial system 10, such as changes of circuit breakers or switches. Synchronizing the digital twin 41 with the industrial system 10 may comprise adapting the digital twin 41 to changes in internal states of IEDs 21, 22, 23.

This synchronization can mainly be from the real-world industrial system 10 to the digital twin 41. The synchronization can cover all system and control relevant data that are also modeled in the digital twin 41. The digital twin 41 is enabled to perform all decisions as the real-world industrial system 10 with all information required for that purpose. The digital twin 41 should be able to perform the control operations of the industrial system 10, but also slower cycle based decisions (e.g. maintenance related).

For an electric system, the digital twin 41 can mimic the time-dependent behavior of both primary and secondary devices, as well as the relevant control components (such as IEDs).

At step 72, a multi-objective optimization is performed based on the digital twin data. The multi-objective optimization may explore a plurality of candidate system settings. As a result of the multi-objective optimization, the computing system 40 may determine one or several suitable candidate system settings for application to the industrial system 10. One or several system objective(s) and/or constraint(s) may change during execution of the multi-objective optimization.

At step 73, it is determined whether an identified system setting is to be transferred to the industrial system 10. The determination step 73 may comprise monitoring a user request for transfer of system settings. The determination step 73 may alternatively or additionally comprise monitoring a trigger event different from a user request. In still other implementations, the system settings may be transferred on an ongoing basis, e.g. periodically or quasi-continuously. If the system settings are not to be transferred, the method may return to step 71. Transfer of system settings may be performed automatically or in response to a user input.

At step 74, if the system settings are to be transferred to the real-world industrial system 10, the system settings may be applied to the industrial system 10. Applying the system settings may comprise adapting settings of intelligent electronic devices, IEDs, 21, 22, 23 of the industrial system 10.

Various mechanisms may be implemented in order to transfer the system settings from the computing system 40 to the industrial system 10. For illustration, the IEDs 21, 22, 23 may respectively execute agents that are responsive to data from the computing system 40, so as to change the settings of the respective IED 21, 22, 23. Alternatively or additionally, a separate master IED may be provided which receives the updated system settings from the computing system 40 and distributes it further on to the IEDs 21, 22, 23.

The application of the system settings at step 74 may be performed on-the-fly, essentially in real time.

Figure 5:
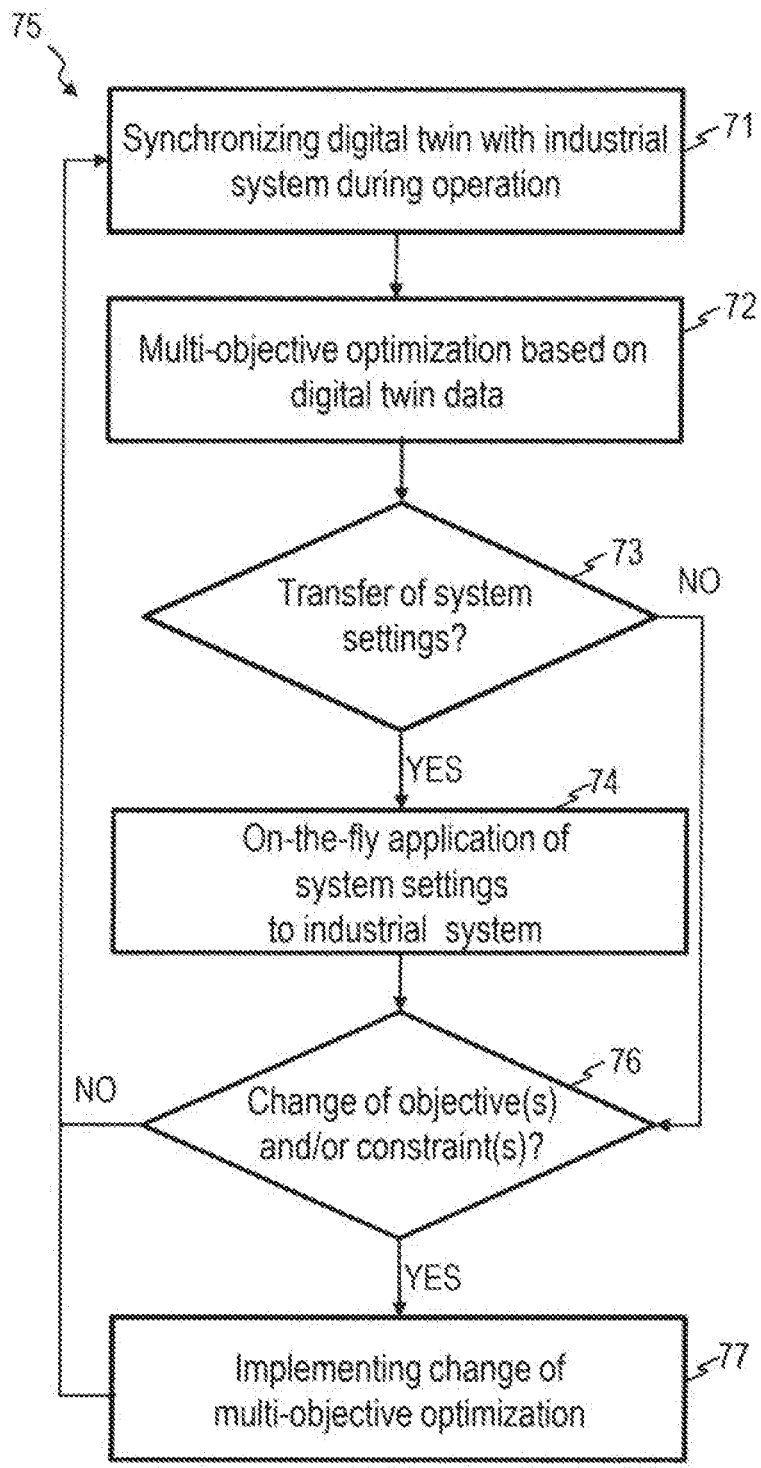
FIG. 5 is a flow chart of a method according to an embodiment.

FIG. 5 is a flow chart of a method 75 according to an embodiment. The method may comprise step 71 to 74, which may be implemented as described with reference to FIG. 4.

The method 75 may be further adapted to allow a system operator to change one or several system objectives and/or one or several system constraints for the multi-objective optimization. For illustration, at step 76, it is determined whether one or several objectives and/or whether one or several system constraints for the multi-objective optimization are changed. A change in objectives may involve a change in the weighting factors in Equations (1) or (2). Alternatively or additionally, a change in objectives may comprise the definition of an additional, new objective, which is incorporated into the objective function of Equations (1) or (2). A change in constraints may comprise lifting or imposing hard constraints and/or changing the weighting factors $\beta_k$ in Equation (2).

At step 77, if one or several objectives and/or constraints of the multi-objective optimization have changed, the change of the multi-objective optimization is implemented. This may involve changing the objective function for which the optimum set of system settings is to be determined, and/or changing hard or soft constraints.

In the methods of FIGS. 2 to 5, the candidate system setting, i.e. the set of parameters that is to be applied to the industrial system 10 may be validated before it is actually applied to the industrial system 10. The validation may again be based on the digital twin 41. A copy of the digital twin 41 may be generated in order to ensure that validation can proceed in parallel with the continuous updating and synchronization of the digital twin 41 with the real-world industrial system 10.

In any one of the embodiments disclosed herein, the optimization routine may not only take into consideration the digital twin data, but also additional data. The additional data may be provided by an external data source or by several external data sources separate and distinct from the industrial system 10. Data sources like weather forecasts, resource prices, etc. are examples for such additional data. In this way, also external price or operational cost parameters can be automatically taken into account when determining optimum system settings.

For illustration, for a DER, the optimum system settings may depend on forecast parameters, such weather forecast data. The computing system 40 may have an interface 45 to retrieve such additional parameters from an external source, as illustrated in FIG. 6. For illustration, the computing system 40 may have an interface 45 that is adapted to retrieve additional information, such as forecast weather information or pricing information for different energy resources, from a database server 81. The computing system 40 may be coupled to the database server 81 via a wide area network 80.

In the methods and computing system 40 according to embodiments, specified system objectives can be explored by continuous system simulations using the digital twin 41. This may be done to generate an approximation of a Pareto-front. The exploration may be performed prior to operation of the industrial system, e.g. during design and commissioning phases, and during an operational phase of the industrial system 10. One or several system objectives and/or one or several system constraints may change while the multi-objective optimization is being performed on an ongoing basis.

At least when the industrial system 10 is in live operation, the digital twin 41 may be continuously synchronized with the industrial system 10.

Information from external sources, such as method for cost data, resource price data, or other data, may be integrated and used in the optimization process.

The method and computing system 40 according to embodiments may output information on the explored solutions of the multi-objective optimization, e.g. information on the explored candidate system settings and their impact on the multi-objective optimization, via a user interface. This allows the system operator to see or analyze the explored solution space and to select new objectives, at any time.

New system settings can be applied on-the-fly by copying parameters determined based on the digital twin to the real system.

The same digital twin may be used to validate the new system settings before they are applied to the industrial system 10.

Various effects are attained by the methods and computing system 40 according to embodiments. For illustration, the methods and computing system 40 allow a system operator to change the system operation objective(s) and/or system constraint(s) whenever needed. Corresponding to the potential new objective(s) and/or system constraint(s), new system settings are explored automatically and can be used on demand.

The outcome of the system simulations is realistic because the digital twin 41 is used. As the digital twin 41 runs in the background, operation of the real-world industrial system 10 is not affected by the search for new system settings.

The real-world industrial system 10 can be updated on-the-fly using the settings from the digital twin. This can be done in a safe manner with respect to the operation of the real-world industrial system 10, because the digital twin 41 can also be used to validate the new system settings.

External information sources can be integrated, as the digital twin 41 and/or the optimization engine 42 can use such additional information (e.g., weather forecast, resource costs). This applies in particular to for costs information.

The methods and computing system 40 according to embodiments can be used during commissioning, i.e., for the initial setting up of the industrial system 10 in a way that is preferred by the system operator. The methods and computing system 40 according to embodiments can be used during live system operation (i.e., after commissioning) for dynamic selection of objectives, exploration of system solutions, and automatic application of system settings, without being limited thereto.

Embodiments of the invention may be used for determining optimum system settings with respect to one or several system objectives and/or one or several constraints of an electric power system, such as a microgrid or DER, without being limited thereto.

While the invention has been described in detail in the drawings and foregoing description, such description is to be considered illustrative or exemplary and not restrictive. Variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

The invention claimed is:

1. A method of determining system settings for an industrial system, the method comprising the following steps performed by a computing system:
retrieving digital twin data of a digital twin of the industrial system, wherein the industrial system comprises a plurality of energy generation and/or storage devices, a plurality of control devices, and a communication network connected to the plurality of control devices, wherein the digital twin is configured to mimic behavior of the plurality of energy generation and/or storage devices and behavior of the plurality of control devices;
synchronizing the digital twin with the industrial system by:
monitoring messages transmitted in the communication network of the industrial system; and
based on the messages transmitted, adapting the digital twin to reflect changes in physical devices of the industrial system;
performing system simulations of the industrial system based on the digital twin data to explore candidate system settings for the industrial system prior to application of one of the candidate system settings to the industrial system, the system simulations being performed on an ongoing basis during commissioning and/or operation of the industrial system,
wherein at least one objective or at least one constraint used in the system simulations is changed while the system simulations are being performed on an ongoing basis; and
providing results of the system simulations for identifying one of the candidate system settings for application to the industrial system.

2. The method of claim 1, wherein the system simulations are performed continuously during commissioning and/or operation of the industrial system.

3. The method of claim 1, wherein the system simulations are performed in a multi-objective optimization routine that uses the digital twin data.

4. The method of claim $_3$, further comprising receiving, at an interface, an input that alters the at least one objective and/or the at least one constraint of the multi-objective optimization, and modifying the multi-objective optimization routine in response to the input.

5. The method of claim 1, wherein performing the system simulations comprises retrieving additional information different from the digital twin data from a source distinct from the industrial system and using the additional information in the system simulations.

6. The method of claim 5, wherein the additional information comprises weather forecast data and/or resource price data.

7. The method of claim 1, further comprising continuously updating the digital twin to ensure consistency of the digital twin with the industrial system during operation of the industrial system.

8. The method of claim 1, further comprising applying the identified one of the candidate system settings on-the-fly to the industrial system.

9. The method of claim 8, wherein applying the identified one of the candidate system settings comprises transferring the one of the candidate system settings identified for the digital twin to the industrial system.

10. The method of claim 8, further comprising, before the applying, validating the identified one of the candidate system settings by:
generating another digital twin of the industrial system; and
simulating the industrial system using the another digital twin with the identified one of the candidate system settings while the digital twin is running in parallel.

11. The method of claim 1, wherein the industrial system is a power grid or part of a power grid.

12. The method of claim 1, wherein the industrial system is a distributed energy resource(DER), or a microgrid.

13. A tangible storage medium having stored thereon computer-readable instruction code comprising instructions to determine system settings for an industrial system which, when executed by at least one processor of a computing system, cause the at least one processor to:
retrieve digital twin data of a digital twin of the industrial system, wherein the industrial system comprises a plurality of energy generation and/or storage devices, a plurality of control devices, and a communication network connected to the plurality of control devices, wherein the digital twin is configured to mimic behavior of the plurality of energy generation and/or storage devices and behavior of the plurality of control devices;
synchronize the digital twin with the industrial system by:
monitoring messages transmitted in the communication network of the industrial system; and
based on the messages transmitted, adapting the digital twin to reflect changes in physical devices of the industrial system;
perform system simulations of the industrial system based on the digital twin data to explore candidate system settings for the industrial system prior to application of one of the candidate system settings to the industrial system, the system simulations being performed on an ongoing basis during commissioning and/or operation of the industrial system;
wherein at least one objective or at least one constraint used in the system simulations is changed while the system simulations are being performed on an ongoing basis; and
provide results of the system simulations for identifying one of the candidate system settings for application to the industrial system.

14. A computing system comprising at least one integrated semiconductor circuit programmed to:
retrieve digital twin data of a digital twin of an industrial system, wherein the industrial system comprises a plurality of energy generation and/or storage devices, a plurality of control devices, and a communication network connected to the plurality of control devices, wherein the digital twin is configured to mimic behavior of the plurality of energy generation and/or storage devices and behavior of the plurality of control devices;
synchronize the digital twin with the industrial system by:
monitoring messages transmitted in the communication network of the industrial system; and
based on the messages transmitted, adapting the digital twin to reflect changes in physical devices of the industrial system;
perform system simulations of the industrial system based on the digital twin data to explore candidate system settings for the industrial system prior to application of the system settings to the industrial system, wherein the system simulations are performed on an ongoing basis during commissioning and/or operation of the industrial system, wherein at least one objective or at least one constraint used in the system simulations is changed while the system simulations are being performed on an ongoing basis; and
provide results of the system simulations for identifying system settings to be applied to the industrial system.

15. The method of claim 3, wherein information on explored solutions of the multi-objective optimization routine including information on explored candidate system settings and their impact on the multi-objective optimization are output via a user interface to allow a system operator to see an explored solution space.

16. The computing system of claim 14, wherein the system simulations are performed in a multi-objective optimization routine that uses the digital twin data.

17. The computing system of claim 16, further comprising a user interface, wherein information on explored solutions of the multi-objective optimization routine including information on explored candidate system settings and their impact on the multi-objective optimization are output via the user interface to allow a system operator to see an explored solution space.

18. The computing system of claim 16, further comprising an interface to receive an input that alters the at least one objective and/or the at least one constraint of the multi-objective optimization, the computing system being programmed to modify the multi-objective optimization routine in response to the input.

19. The computing system of claim 14, wherein the computing system is programmed to validate the identified system settings to be applied to the industrial system by:
generating a copy of the digital twin; and
running the copy of the digital twin with the identified system settings in parallel with the digital twin.

* * * * *